US008631290B2

(12) United States Patent
Zandian et al.

(10) Patent No.: US 8,631,290 B2
(45) Date of Patent: Jan. 14, 2014

(54) AUTOMATED DETECTION OF AND COMPENSATION FOR GUARDBAND DEGRADATION DURING OPERATION OF CLOCKED DATA PROCESSING CIRCUIT

(75) Inventors: Bardia Zandian, Los Angeles, CA (US); Murali Annavaram, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 140 days.

(21) Appl. No.: 13/327,561

(22) Filed: Dec. 15, 2011

(65) Prior Publication Data

US 2012/0159276 A1    Jun. 21, 2012

Related U.S. Application Data

(60) Provisional application No. 61/423,770, filed on Dec. 16, 2010.

(51) Int. Cl.
*G01R 31/28* (2006.01)

(52) U.S. Cl.
USPC ............................ 714/731; 714/738; 714/797

(58) Field of Classification Search
USPC ........... 714/731, 724, 738, 797, 726, 764, 11, 714/12, 15
See application file for complete search history.

(56) References Cited

U.S. PATENT DOCUMENTS 5,809,220 A * 9/1998 Morrison et al. ............... 714/12
5,966,376 A * 10/1999 Rakib et al. .................. 370/342
7,472,320 B2 * 12/2008 Berndlmaier et al. ........ 714/724

OTHER PUBLICATIONS

Abella, J. et al. 2007. Penelope: The NBTI—Aware Processor. Proc. International Symposium on Microarchitecture, pp. 85-96.
Agarwal, M. et al. 2007. Circuit Failure Prediction and Its Application to Transistor Aging. Proc. 25th IEEE VLSI Test Symposium, pp. 277-284, 2007.
Alam, M.A. et al. 2005. A Comprehensive Model of PMOS NBTI Degradation. Microelectronics Reliability, vol. 45, pp. 71-81, Jan. 2005.
Austin, T.M. 1999. DIVA: A Reliable Substrate for Deep Submicron Microarchitecture Design. Proc. 32nd Annual International Symposium on Microarchitecture, pp. 196-207.
Baba, A.H. et al. 2009. Testing for Transistor Aging. 2009 27th IEEE VLSI Test Symposium, pp. 215-220.
Blome, J. et al. 2007. Self-Callibrating Online Wearout Detection. Proc. 40th Annual IEEE/ACM International Symposium on Microarchitecture, pp. 109-120.

(Continued)

*Primary Examiner* — Fritz Alphonse
(74) *Attorney, Agent, or Firm* — McDermott Will & Emery LLP

(57) ABSTRACT

An automated guardband compensation system automatically compensates for degradation in the guardband of a clocked data processing circuit while that circuit is connected within a data processing system. A control circuit automatically and repeatedly requests: a switching circuit to switch a critical path within the clocked data processing circuit out of a data processing pathway within the data processing system while the clocked data processing circuit is connected within the data processing system; a guardband test circuit to test the guardband of the critical path while the critical path is switched out of the data processing pathway; a guardband compensation circuit to increase the guardband when the results of the test indicate a material degradation in the guardband; and a switching circuit to switch the critical path back into the data processing pathway after the test.

22 Claims, 7 Drawing Sheets

(56) References Cited

OTHER PUBLICATIONS

Bower, F.A. et al. 2005. "A Mechanism for Online Diagnosis of Hard Faults in Microprocessors," Proc. 38th Annual IEEE/ACM International Symposium on Microarchitecture (Micro '05), pp. 197-208.
Cabe, A.C. et al. 2009. Small Embeddable NBTI Sensors (SENS) for Tracking on-Chip Performance Decay. Proc. 10th International Symposium on Quality Electronic Design, pp. 1-6.
Constantinides, K. et al. 2006. BulletProof: A Defect-Tolerant CMP Switch Architecture. Proc. 12th International Symposium on High-Performance Computer Architecture, pp. 3-14.
Drake, A. et al. 2007. A Distributed Critical-Path Timing Monitor for a 65nm High-Performance Microprocessor. Proceedings of the 2007 IEEE International Solid State Circuits Conference, pp. 398-399, Feb. 2007.
Ernst, D. et al. 2003. Razor: A Low-Power Pipeline Based on Circuit-Level Timing Speculation. Proc. 36th International Symposium on Microarchitecture (MICRO-36 '03), pp. 7-18.
Karl, E. et al. 2008. Compact in Situ Sensors for Monitoring Negative-Bias-Temperature-Instability Effect and Oxide Degradation. Proc. of the 2008 IEEE International Solid State Circuits Conference, pp. 410-411.
Keane, J. et al. 2010. An On-Chip NBTI Sensor for Measuring pMOS Threshold Voltage Degradation. IEEE Transactions on Very Large Scale Integration (VLSI) Systems, vol. 18, No. 6, pp. 947-956, Jun. 2010.
Kim, T.H. et al. 2008. Silicon Odometer: An On-Chip Reliability Monitor for Measuring Frequency Degradation of Digital Circuits. IEEE Journal of Solid-State Circuits, vol. 43, No. 4, pp. 874-880, Apr. 2008.
Li, Y.J. et al. 2008 CASP: Cooncurrent Autonomous Chip Self-Test Using Stored Test Patterns. Design, Automation and Test in Europe, pp. 885-890.
Shin, J. et al. 2007. A Framework for Architecture-Level Lifetime Reliability Modeling. Proc. 37th Annual IEEE/IFIP International Conference on Dependable Systems and Networks (DSN '07), pp. 534-543.
Shyam, S. et al. 2006. Ultra Low-Cost Defect Protection for Microprocessor Pipelines. ACM Sigplan Notices, vol. 41, pp. 73-82, Nov. 2006.
Smolens, J. et al. 2007. Detecting Emerging Wearout Faults. Proc. IEEE Workshop on Silicon Errors in Logic—System Effects, 6 pages.
Srinivasan, J. et al. 2004. The Case for Lifetime Reliability-Aware Microprocessors. Proc. 31st Annual International Symposium on Computer Architecture (ISCA '04), pp. 276-287.
Stawiasz, K. et al. 2008. On-Chip Circuit for Monitoring Frequency Degradation Due to NBTI. Proc. 2008 IEEE International Reliability Physics Symposium Proceedings—46th Annual, pp. 532-535.
Zandian, B. et al. 2010. WearMon: Reliability Monitoring Using Adaptive Critical Path Testing. Dependable Systems and Networks, pp. 151-160.

\* cited by examiner

AUTOMATED DETECTION OF AND COMPENSATION FOR GUARDBAND DEGRADATION DURING OPERATION OF CLOCKED DATA PROCESSING CIRCUIT

CROSS-REFERENCE TO RELATED APPLICATION

This application is based upon and claims priority to U.S. provisional patent application 61/423,770, entitled "Method and Apparatus for Continuous Circuit Reliability Monitoring Using Self-Managed Adaptive Critical Path Testing," filed Dec. 16, 2011. The entire content of this application is incorporated herein by reference.

STATEMENT REGARDING FEDERALLY SPONSORED RESEARCH

This invention was made with government support under Grant Nos. CCF-0834798 and CCF-0834799 awarded by the National Science Foundation. The government has certain rights in the invention.

BACKGROUND

1. Technical Field

This disclosure relates to integrated circuits and to guardbands that are implemented in connection with them.

2. Description of Related Art

Reduced processor reliability can be a negative repercussion of silicon scaling. Reliability concerns may stem from multiple factors, such as manufacturing imprecision that leads to several within-in die and die-to-die variations, ultrathin gate-oxide layers that breakdown under high thermal stress, negative bias temperature instability (NBTI), and electromigration. Wearout may be one manifestation of these reliability concerns. Wearout may include the gradual timing degradation of devices and their eventual breakdown. Timing degradation may occur extremely slowly over time and can even be reversed in some instances, such as when degradation is caused by NBTI effects. When individual device variations are taken into consideration, this timing degradation may be hard to predict or accurately model.

Commercial products may make worst-case assumptions on timing degradation and may insert a guardband at design time to tackle wearout. Guardbanding may be achieved by reducing frequency or increasing voltage. However, guardbands may reduce performance of a chip during their entire lifetime just to ensure correct functionality during a small fraction of time near the end of this lifetime.

Another approach may be to use error detection and recovery methods. However, these can be costly.

SUMMARY

An automated guardband compensation system may automatically compensate for degradation in the guardband of a clocked data processing circuit while that circuit is connected within a data processing system. A switching circuit may, when requested, switch a critical path in the clocked data processing circuit out of and back into a data processing pathway in the data processing system while the clocked data processing circuit is connected within the data processing system. A guardband test circuit may, when requested, test for degradation in the guardband of the critical path while the critical path is switched out of the data processing pathway. A guardband compensation circuit may, when requested, increase the guardband. A control circuit may automatically and repeatedly request: the switching circuit to switch the critical path out of the data processing pathway while the clocked data processing circuit is connected within the data processing system; the guardband test circuit to test the guardband of the critical path while the critical path is switched out of the data processing pathway; the guardband compensation circuit to increase the guardband when the results of the test indicate a material degradation in the guardband; and the switching circuit to switch the critical path back into the data processing pathway after the test.

The clocked data processing circuit may be operated within the data processing system at a normal clock frequency. The guardband test circuit may test for degradation in the guardband by testing the critical path at multiple, different test clock frequencies, each higher than the normal clock frequency. The guardband test circuit may test for degradation in the guardband by detecting whether the clocked data processing circuit fails to function properly at any of the test clock frequencies.

A test vector storage system may contain multiple test vectors. Each may test a different critical path in the clocked data processing circuit while that circuit is connected within the data processing system. The guardband test circuit may use the test vectors to test different critical paths in the clocked data processing circuit for degradation in the guardband of each tested critical path.

A result may be stored in the test vector storage system for each test vector that is indicative of how the critical path that is associated with the test vector should function in response to the test. The guardband test circuit may test each critical path by determining whether the result that it produces in response to the test vector that tests it is consistent with the corresponding result stored in the test vector storage system.

The test vector storage system may store at least one test vector that is configured to test a non-critical path in the clocked data processing circuit while that circuit is connected within the data processing system. The guardband test circuit may, when requested, test for degradation in the guardband of the at least one non-critical path while the non-critical path is switched out of a data processing pathway.

The test vectors may be selected based on the degree to which their associated critical paths are used during normal operation of the data processing system.

The guardband compensation circuit may increase the guardband by decreasing the clock frequency, increasing the operating voltage, and/or switching in a replica of at least a portion of the clocked data processing circuit in place of at least that portion of the clocked data processing circuit.

The critical path may not contain any data storage element, other than at the beginning or end of the path.

The control circuit may make the requests to the switching circuit and to the guardband test circuit periodically and/or during idle periods of the clocked data processing circuit. The control circuit may alter the frequency of the repeated requests based on one or more operating conditions of the clocked data processing circuit.

A test result storage system may store the results of the tests. The control circuit may alter the frequency of the repeated requests based on the results of the tests that are stored in the test results storage system.

The automated guardband compensation system and the clocked data processing circuit may be within a common integrated circuit.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
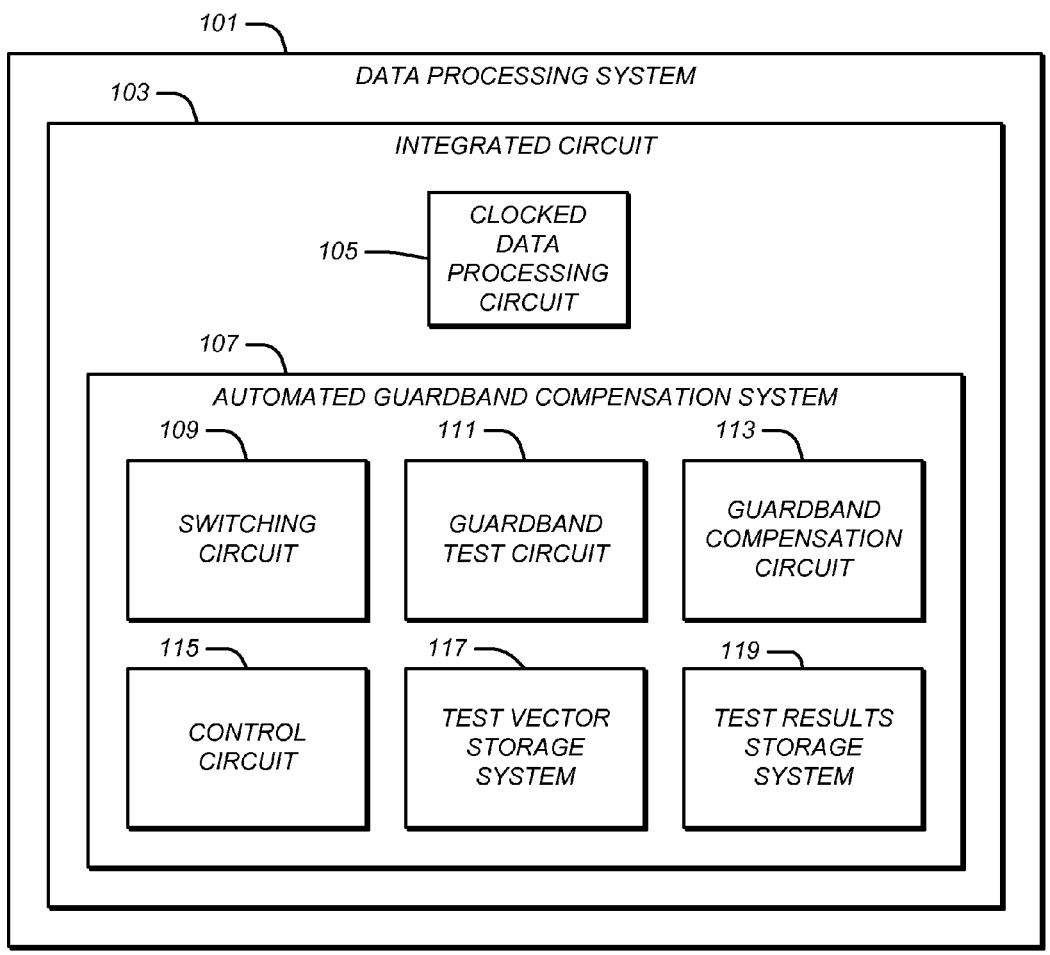
FIG. 1 illustrates a data processing system containing an integrated circuit that includes a clocked data processing circuit and an automated guardband compensation circuit.

FIG. 1 illustrates a data processing system 101 containing an integrated circuit 103 that includes a clocked data processing circuit 105 and an automated guardband compensation system 107. Although illustrated as both being within the integrated circuit 103, the clock data processing circuit 105 and the automated guardband compensation system 107 may be in different integrated circuits. All or portions of the clock data processing circuit 105 and/or the automated guardband compensation system 107 may instead be made of discrete components.

The clocked data processing circuit 105 may be of any type. For example, the clocked data processing circuit 105 may be a microprocessor, a circuit within a microprocessor, graphics processing unit, a circuit within a graphics processing unit, or an embedded processor.

Similarly, the data processing system 101 may be of any type. For example, the data processing system 101 may be a desktop computer, laptop computer, handheld computer, tablet computer, mobile computer, embedded computer system, or sensor system.

The clocked data processing circuit 105 may be operated within the data processing system 101 at a normal clock frequency, sometimes also referred to as nominal clock frequency. This frequency may be selected to be slow enough to ensure sufficient time for the clocked data processing circuit 105 to perform all of its data processing functions without error. To facilitate this, the normal clock frequency may be set below the maximum frequency at which the clocked data processing circuit 105 may operate without error. The difference between this normal clock frequency and this maximum frequency is referred to herein as a guardband.

The clock data processing circuit 105 may contain several different signal pathways, such as data or control paths. Some of these pathways may take longer to process signals than others. The pathways that take the longest are referred to herein as the "critical paths." An arbitrary cut off may be used to distinguish between critical and non-critical paths. For example, the "critical paths" may be defined as those paths that have a delay of at least 90% of a clock cycle. A different cut off may be used instead.

The automated guardband compensation system 107 may be configured to automatically compensate for degradation in the guardband of the clock data processing circuit 105 while that circuit is connected within the data processing system 101. The automated guardband compensation system 107 may include a switching circuit 109, a guardband test circuit 111, a guardband compensation circuit 113, a control circuit 115, a test vector storage system 117, and/or a test results storage system 119.

The switching circuit 109 may be configured, when requested, to switch a critical path in the clocked data processing circuit 105 out of and back into the data processing pathway in the data processing system 101 while the clock data processing circuit 105 is connected within the data processing system 101. The critical path may not contain any data storage element, other than at the beginning or end of the path.

The guardband test circuit 111 may be configured, when requested, to test for degradation in the guardband of the critical path while the critical path is switched out of the data processing pathway. The guardband test circuit 111 may be configured to test for degradation in the guardband by testing the critical path at multiple, different test clock frequencies, each higher than the normal clock frequency. The guardband test circuit 111 may test for degradation in the guardband by detecting whether the clock data processing circuit 105 fails to perform properly at any of the test clock frequencies.

The test vector storage system 117 may contain multiple test vectors. Each test vector may be configured to test a different critical path in the clock data processing circuit 105 while that circuit is connected within the data processing system 101. To facilitate this, each test vector may contain data that, when applied to the clock data processing circuit 105, causes a particular critical path to be utilized. The switching circuit 109 and then the guardband test circuit 111 may both use each test vector to switch and then test, respectively, the critical path to which it relates.

A result may be stored in the test vector storage system 117 for each test vector that is indicative of how the critical path that is associated with the test vector should function in response to the test. The guardband test circuit 111 may be configured to test each critical path by determining whether the result that it produces in response to the test vector that it tests is consistent with the corresponding result stored in the test vector storage system 117.

The test vector storage system 117 may be configured to store at least one test vector that is configured to test a non-critical path in the clock data processing circuit 105 while that circuit is connected within the data processing system 101. Correspondingly, the guardband test circuit 111 may be configured, when requested, to test for degradation in the guardband of the least one non-critical path while the non-critical path is switched out of the data processing pathway.

The critical paths that are selected to be the subject of the test vectors may be selected based on any criteria. For example, the critical paths may be selected based on the degree to which they are used during normal operation of the data processing system 101. Critical paths that are more frequently used may be given preference.

The guardband compensation circuit 113 may be configured, when requested, to increase the guardband. The guardband compensation circuit 113 may be configured to increase the guardband by decreasing the clock frequency of the clocked data processing circuit 105, by increasing the operating voltage of the clock to data processing circuit 105, and/or by switching in a replica of a least a portion of the clocked data processing circuit 105 in place of this portion of the clocked data processing circuit 105.

The test results storage system 119 may be configured to store the results of the tests.

The control circuit 115 may be configured to automatically and repeatedly request: the switching circuit 109 to switch the critical path out of the data processing pathway while the clocked data processing circuit 105 is connected within the data processing system 101; the guardband test circuit 111 to test the guardband of the critical path while the critical path is switched out of the data processing pathway; the guardband compensation circuit 113 to increase the guardband when the results of the test indicate a material degradation in the guardband; and the switching circuit 109 to switch the critical path back into the data processing pathway after the test. The control circuit 115 may be configured to make these requests to the switching circuit 109 and to the guardband test circuit 111 periodically and/or during idle periods of the clock data processing circuit 105 and/or the data processing system 101. The control circuit 115 may be configured to alter the frequency of the repeated request based on one or more operating conditions of the clock data processing circuit 105, such as the frequency of operation, the temperature of operation, and/or the operating voltage of the circuit. For example, the frequency of the test may be reduced if the clock data processing circuit 105 is not used frequently and/or operates at a low temperature. Conversely, the frequency may be increased if the clock data processing circuit 105 is used frequently and/or operates at a high temperature.

The control circuit 115 may in addition or instead be configured to alter the frequency of these repeated requests based on the results of the tests that are stored in the test results storage system 119. For example, the frequency may be increased when the test results indicate a significant reduction in the guardband. Conversely, the frequency may be decreased when the test results indicate no significant reduction in the guardband.

Various approaches may be taken in implementing the various components of the automated guardband compensation system 107 described above. Examples of these will now be presented. They are merely illustrative, not exhaustive.

Wearout Monitoring

What has been described is a runtime reliability monitoring framework that may use adaptive critical path testing. Specially designed test vectors may be injected into a circuit-under-test (CUT), such as the clocked data processing circuit 105, by the guardband test circuit 111 that not only measure functional correctness of the CUT but also its timing margin. The outcomes of these tests may be analyzed to get a measure of the current timing margin of the CUT. Furthermore, a partial set of interesting events from test results may be stored in non-volatile memory, such as a hard disk or flash memory, to provide a view into timing margin degradation process over long time scales.

This reliability may be monitored continuously over extended periods of time; possibly many years.

The monitoring may dynamically adapt to changing operating conditions. Due to differences in device activation factors and device variability, timing degradation rate may differ from one CUT to the other. Even a chip in early stages of its expected lifetime can become vulnerable due to aggressive runtime power and performance optimizations such as operating at near-threshold voltages and higher frequency operation.

The monitoring architecture may have low area and performance overhead. Furthermore, the monitoring framework may be implemented with minimal modifications to existing processor structures.

With continuous, adaptive and low-overhead monitoring, conservative preset guardbands can be tightened and a processor can deploy preemptive error correction measures during in-field operations only when the measured timing margin of the circuit is small enough to affect its functionality. Designers may use the view of timing degradation to correlate predicted behavior from analytical models with the in-field behavior and use these observations to make appropriate design changes for improving reliability of future processors.

Wearout Monitoring Applications

Reliance on electronic control circuits and computers which control mission critical systems is increasing. Hence, the capability to observe and manage the reliability state of these computer systems at the chip level may be of great importance where high reliability is essential. De-grading reliability of devices with each scaled technology generation and the increasing number of devices used in each circuit can make test and verification of all devices on a chip an almost impossible task at fabrication time. Critical hardware can be enhanced with wearout monitoring and reporting. When certain low thresholds of reliability and/or performance are reached, maintenance requests can be initiated.

Wearout monitoring information can be used for triggering automated activation of cold spares or requests for replacement before any failures occur. The real-time knowledge regarding the wearout state of the circuit can directly be used by adaptive management mechanisms to trade off reliability, performance, and power consumption. Furthermore, wearout monitoring may allow designers to build circuits which keep the same level of reliability over their lifetime, even when the underlying components wearout. By monitoring wearout, the designer may compensate for decreasing margins (and resultant reliability reduction) by reducing performance and/or power efficiency. Circuits may be fast, power efficient, and reliable when they are new, but may gradually loose performance and power efficiency, and yet they still remain reliable. This gradual power/performance degradation may be a better solution than paying overheads associated with long-term static guardbands designed for the worst-case.

Reliability Monitoring Framework

Critical paths in the CUT may be tested. Specially designed test vectors may be stored in an on-chip repository and may be selected for injection into the CUT at specified time intervals. The current timing margin of the CUT may be measured using outcomes from these tests. One specific implementation may be in the form of a reliability monitoring unit (RMU). Using the RMU, critical path test vectors may be used for checking the CUT.

Architecture of Monitoring Unit

Figure 2:
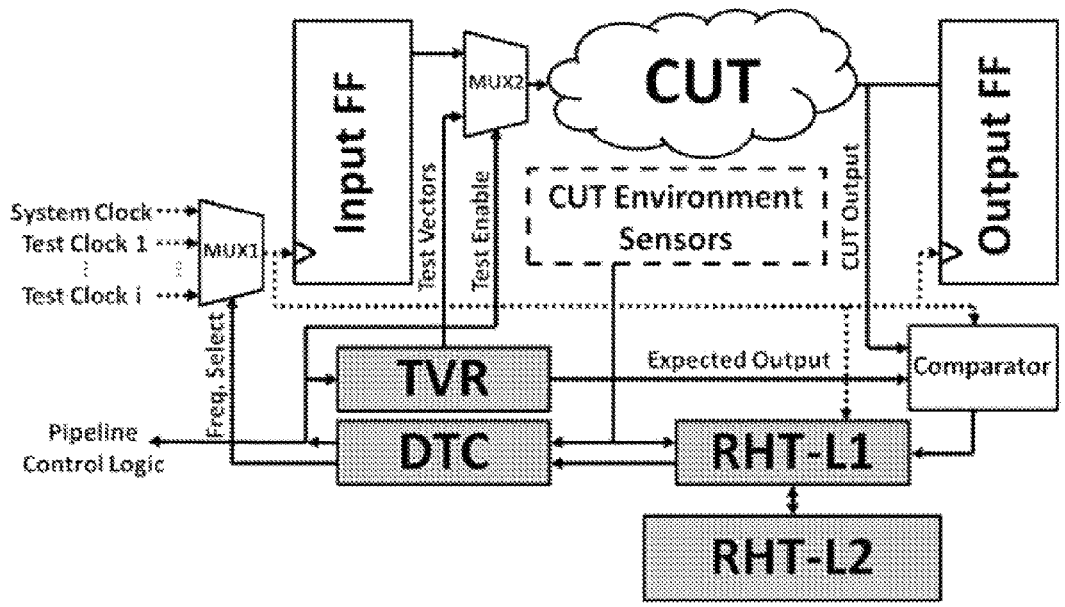
FIG. 2 illustrates an example of a reliability monitoring unit (RMU) and how it interfaces with a circuit under test (CUT).

FIG. 2 illustrates an example of an RMU and how it interfaces with a CUT. This RMU may function as at least portions of the automated guardband compensation system 107 illustrated in FIG. 1. A CUT may contain any number of data or control signal paths that end in flip-flops, but it may not contain any intermediate storage elements.

The four shaded boxes in the figure are components of the RMU. The test vector repository (TVR) is an example of the test vector storage system 117 and may hold a set of test patterns (aka vectors) and the expected correct outputs when these test patterns are injected into the CUT. The TVR may be filled once with CUT-specific test vectors during a post-fabrication phase. A multiplexer, MUX1, is an example of a portion of the switching circuit 109 and may be used to select either the regular operating frequency of the CUT or one test frequency from a small set of testing frequencies. Multiplexer, MUX2, is another example of a portion of the switching circuit 109 and is on the input path of the CUT. It may allow the CUT to receive inputs either from normal execution trace or from TVR. MUX1 input selection may be controlled by a Freq. Select signal, and MUX2 input selection may be controlled by a Test Enable signal. Both signals may be are generated by a Dynamic Test Control (DTC) unit which is an example of at least a portion of the control circuit 115.

The DTC may select a set of test vectors from the TVR to inject into the CUT and the test frequency at which to test the CUT. After each test vector injection, the CUT output may be compared with the expected correct output and a test pass/fail signal may be generated. For every test vector injection, an entry may be filled in the reliability history table (RHT), which is an example of at least a portion of the test results storage system 119. Each RHT entry may store a time stamp of when the test is conducted, test vector, testing frequency, pass/fail result, and/or CUT temperature. The RHT may be implemented as a two-level structure where the first level (RHT-L1) stores only the most recent test injection results on an on-die SRAM structure. The second level RHT (RHT-L2) may be implemented on a flash memory that can store test history information over multiple years. While RHT-L1 may store a complete set of prior test injection results within a small time window, RHT-L2 may stores only interesting events, such as test failures and excessive thermal gradients over the entire lifetime of the chip. The DTC may read the RHT-L1 data to determine when to perform the next test, as well as how many circuit paths to test in the next test phase.

Test Vector Selection

Micro architectural circuit blocks may often be segregated into three groups of circuit paths. A first group may contain a few paths (<1%) with zero timing margin; a second group may contain several paths (about 10%) with less than 10% timing margin. The last group (about 90%) may have a larger timing margin. The paths in the first and second groups may be considered to be critical paths. Those in the third group may be considered to be non-critical paths. Test vectors may be identified that activate the first two groups of critical paths. These paths may be the ones with the least amount of timing margin and may be most susceptible to timing failures. These paths may be identified by manual testing and/or by standard place-and-route tools that can classify the paths into categories based on their timing margin and then generate test vectors for activating them. The TVR may be initially filled with test vectors that test paths with less than 10% timing margin. The TVR may store in the order of 50-100 test vectors. The TVR may store vectors in the sorted order of their timing criticality once during the post-fabrication phase. Compression techniques may be used to reduce the storage needs of TVR.

Figure 3:
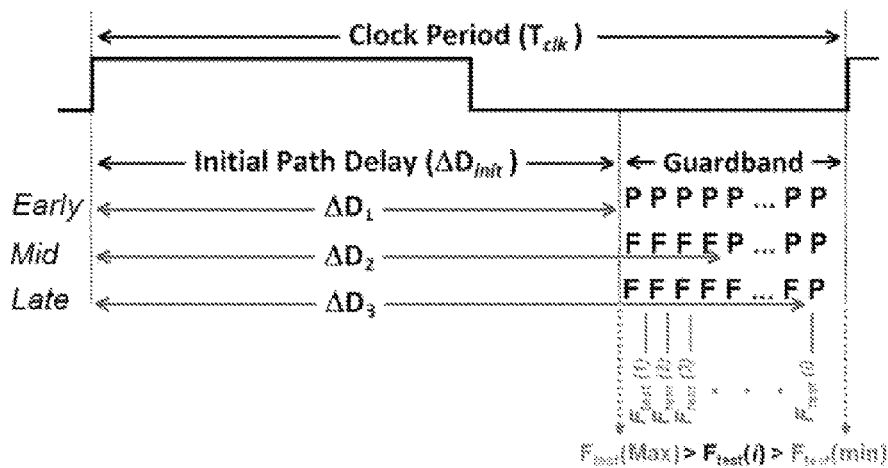
FIG. 3 illustrates how higher operation frequencies can be achieved using reduced guardband (RGB) when timing degradation monitoring enhancements are used.

FIG. 3 illustrates how higher operation frequencies can be achieved using reduced guardband (RGB) when timing degradation monitoring enhancements are used.

Test Frequency Selection

To accurately monitor the remaining timing margin of paths in the CUT, they may be tested at multiple test frequencies above the nominal operation frequency of the CUT. The difference between the highest frequency at which a path passes a test and the nominal operation frequency may determine the current remaining timing margin for that path. The test frequency range may be selected between the nominal operating frequency and a frequency without a guardband. This range may then be divided into multiple frequency steps.

FIG. 2 illustrates an example of these testing clock frequencies. Multiple clock frequencies for testing, Ftest(i), can be selected between Ftest(Max) and Ftest(min). The highest clock frequency which can be used for a test may be equal to an operation frequency at which no guardband is used (i.e. Ftest(Max)=1/$\Delta$Dinit). $\Delta$Dinit is the initial delay of the slowest paths in the CUT. The slowest clock frequency used for testing, Ftest(min), is equal to the nominal operation frequency of the CUT which is 1/Tclk. The nominal clock period of the circuit (Tclk) may be defined at design time as the delay of the slowest path in the CUT, $\Delta$Dinit, plus a guardband. The number of test frequencies used, i, may depend on the area and power budget allocated for reliability monitoring enhancements. Larger number of test frequency steps may increase the precision of the detected timing margin degradation but may have a higher implementation overhead.

FIG. 2 illustrates the pass (P) and fail (F) results for tests conducted on a path at different stages of the CUT lifetime. In the scenarios illustrated on FIG. 2, path delays $\Delta$D1, $\Delta$D2, and $\Delta$D3 represent the increased path delay due to wearout at different stages of circuit's lifetime. Initially, all tests at all test frequencies may pass because the delay of the path has not degraded to be larger than $\Delta$Dinit, this is labeled as Early on FIG. 2. In this scenario, $\Delta$D1 may be smaller or equal to $\Delta$Dinit. Scenarios labeled Mid and Late illustrate the timing degradation of the path as it gradually suffers from wearout. In the Mid scenario, only four tests conducted at the high end of the test frequency range fail and the rest of the tests pass. In the Late scenario, only one test conducted at the low end of the test frequency range passes and the rest of the tests fail. In all of these scenarios, the highest test frequency at which a test passes may indicate the remaining timing margin of the path tested.

Figure 4:
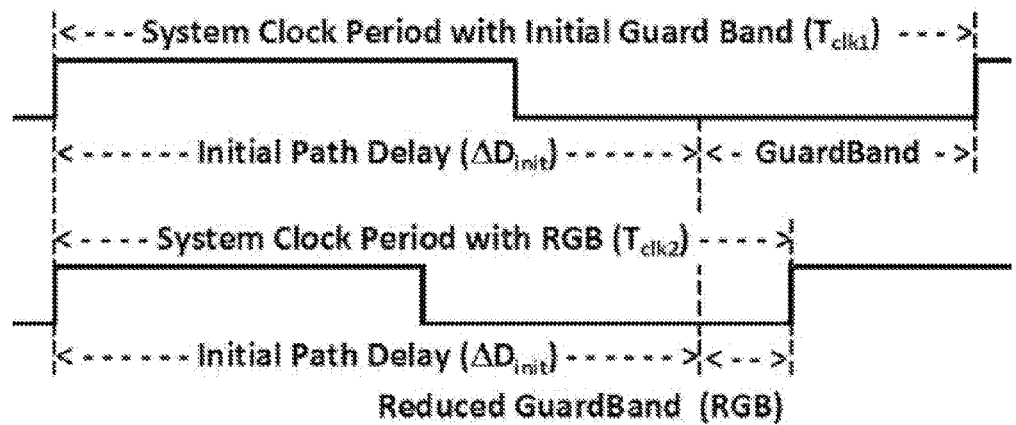
FIG. 4 illustrates how it may be possible to reduce a default guardband to a smaller value while still meeting reliability goals.

FIG. 4 illustrates how it may be possible to reduce the default guardband to a smaller value while still meeting the same reliability goals. In FIG. 4, (Tclk1=1/fclk1)>(Tclk2=1/fclk2)>(ΔDinit). Tclk1 is the original clock period when using the default guardband, and Tclk2 is the clock period with a reduced guardband (RGB). Note that in either case the initial path delay, ΔDinit, of the CUT may be the same. The system may continuously monitor the CUT and check if CUT timing is encroaching into the reduced guardband. RGB is a performance improvement made possible by RMU, but it is not necessary to reduce the guardband for correct operation. In addition to the performance enhancement, using RGB may also result in a smaller test frequency range and hence can reduce monitoring overhead.

DTC and Opportunistic Tests

The DTC may determine the interval between tests (hereinafter just "interval") and the number of test vectors to inject during each test phase (hereinafter "complexity"). These two design choices may exploit tradeoffs between increased accuracy and decreased performance due to testing over-head.

The DTC may read the most recent RHT entries to decide the interval and complexity of the future testing phases. The most recent RHT entries may be analyzed by the DTC to see if any tests have failed during the testing phase. Each failed test entry may indicate which test vector did not produce the expected output and at what testing frequency. The DTC may then select the union of all of the failed test vectors to be included in the next phase of testing. If no prior tests have failed, the DTC may simply select a set of test vectors from the top of the TVR.

The minimum number of test vectors that may be needed for one path to get tested for a rising or a falling transition may be two. Instead of using just two input combinations that sensitize only the most critical path in the CUT, multiple test vectors that exercise a group of critical paths in the CUT may be used in each test phase. Thus, test vectors used in each test phase may be a small subset of the vectors stored in the TVR. This subset may be dynamically selected by the DTC based on the history of test results and the CUT's operating condition. Initially, the DTC may select test vectors in the order from the most critical (slowest) path at design time to less critical paths. As path criticality changes during the lifetime of the chip, cases might be observed where paths that were initially thought to be faster are failing while the expected slower paths are not. The order of the critical paths tested can be dynamically updated by the DTC by moving the failing input patterns to the top of the test list. To account for the unpredictability in device variations, the DTC may also randomly select additional test vectors from the TVR during each test phase, making sure that all the paths in the TVR are checked frequently enough. This multi-vector test approach may allow more robust testing, since critical paths may change over time due to different usage patterns, device variability, and difference in the devices present on each signal path.

Once the test complexity has been determined, the DTC may then select the test interval. One approach for selecting when to initiate the next test phase is for the DTC to initially select a large test interval, say, 1 million cycles between two test phases, and then the DTC dynamically alters the test interval to be inversely proportional to the number of failures seen in the past few test phases. For instance, if two failures were noticed in the last eight test phases then the DTC may decrease the new test interval to be half of the current test interval.

Another approach to determine test interval is opportunistic testing. In this approach, the DTC may initiate a test injection only when the CUT is idle, thereby resulting in zero performance overhead. Current microprocessors provide multiple such opportunities for testing a CUT. For example, on a branch mis-prediction, the entire pipe-line may be flushed and instructions from the correct execution path may be fetched into a pipeline. Execution, writeback, and retirement stages of the pipeline may be idle waiting for new instructions, since the newly fetched instructions may take multiple cycles to reach the backend. When a long latency operation such as an L2 cache miss is encountered, even aggressive out-of-order processors may be unable to hide the entire miss latency, thereby stalling the pipeline. Computer system utilization also rarely reaches 100% and the idle time between two utilization phases may provide an opportunity to test any CUT within the system.

The DTC can automatically adapt to the reliability needs of the system. For a CUT which is unlikely to have failures during the early stages of its in-field operation, test interval may be increased and test complexity may be reduced. As the CUT ages or when the CUT is vulnerable due to low power settings, the DTC can increase testing. The time scale for test interval may be extremely long. For instance, NBTI related timing degradation may occur only after many seconds or minutes. Hence testing interval may be in the order of seconds even in the worst case.

Testing the CUT may not in itself lead to noticeable increase in aging of the CUT. The percentage of time a CUT is tested may be negligible compared to the normal usage time.

There are many design alternatives to several of the RMU components described. For implementing variable test frequencies, for example, there may be existing infrastructures for supporting multiple clocks within a chip. For instance, dynamic voltage and frequency scaling (DVFS) may be supported on processors for power and thermal management. While the current granularity of scaling frequency may be too coarse, it may be possible to create much finer clock scaling capabilities. Alternatively, an aging resilient delay generator may be used with minimal area and power overhead.

Dynamic Path Delay Variations

Due to the limited size of the TVR, it may be possible that for some circuits the number of critical paths that need to be tested exceed the size of the TVR. Hence, a designer may be forced to select only a subset of the critical paths to be tested. Furthermore, finding all the critical paths can be challenging. This may be due to following reasons:
1. Critical paths found at design stage using static timing analysis of the circuit might not be the slowest paths in the manufactured circuit due to variations in the fabrication process.
2. The amount of wearout devices in a circuit suffer from may vary depending on how they are utilized and their operation condition. Accurate design time predictions regarding in-field runtime utilization of circuit paths and variations in operation environment conditions, such as temperature, can be difficult. These runtime effects may result in non-uniform wearout of devices and circuit paths. As a result, the critical paths can change during runtime.

To overcome this impediment, the monitoring framework may be enhanced to dynamically update the TVR contents during in-field operation of the circuit. An auxiliary TVR with higher capacity than the main TVR can be implemented on off-chip flash memory. The auxiliary TVR may store test vectors for the entire cluster of critical paths. The test vectors may be periodically used in the auxiliary TVR to check the circuit with larger coverage. After the extended test phase, all the paths may be sorted based on their timing margin. The top N critical paths, where N is the size of the main TVR, may then be selected. Test vectors that test these N critical paths may be used to update the content of the main TVR. This approach may ensure that the main TVR always holds the test vectors required for testing the most critical paths in the circuit.

For example, assume that a CUT has 10,000 paths of which 4000 paths are marked as critical during design time using static timing analysis. Assume that the main TVR is designed to store test vectors for checking the top 1000 slowest paths. At design time, the TVR may be filled with test vectors for the top 1000 slowest paths in the CUT. In addition, test vectors may be stored to test all 4000 critical paths in the auxiliary TVR. During the normal test phases, vectors stored in TVR may be injected into the CUT and the slowest 1000 path in the circuit may get checked routinely. However, test may occasionally be performed with a much larger coverage using the larger auxiliary test vector group. At specific time intervals (e.g. every month), which may be much larger than the normal test intervals, the test vectors stored in the auxiliary TVR may be brought into the chip for conducting tests. Result of this infrequent testing with larger coverage may then be used to refine the selection of the 1000 paths which may be monitored during the next month of utilization. In other words, the top 1000 slowest paths in the 4000 paths tested may replace the old 1000 paths in the TVR for the next month of operation. These infrequent but more robust test cycles may provide feedback from the actual runtime timing degradation of extended group of circuit path and may ensure that that the TVR always has the test vectors for testing the slowest paths in the circuit.

While this approach may ensure that dynamic variations of critical paths are accounted for, the fundamental assumption is that a non-critical path that is not tested by vectors either in main or auxiliary TVR will not fail while all the critical paths that are tested are still operational. Due to the physical nature of the phenomena causing aging related timing degradation, the probability of a path which is not in the TVR failing before any of the circuit paths that are being tested may be extremely low. In particular, the probability of a sudden large variation in threshold voltage which results in large path delay changes may be nearly zero. Thus, the probability of an untested path failing may be the same as the probability of a path with timing margin greater than the guardband suddenly deteriorating to the extent that it violates timing.

Hard Failure Detection

The test vectors may not explicitly check for hard errors (Stuck-at-1 and stuck-at-0). However, these errors may be detected by this monitoring mechanism. In systems enhanced with redundancy, detection of permanent hard errors can be used to disable faulty circuit blocks and/or enable cold spares. At each test phase, a group of circuit paths may be tested with multiple test frequencies. If the test results show a path is failing at all test frequencies and this failure pattern repeats itself even after attempts to operate at a lower operation frequency, this may be an indication of possible hard failures in the circuit. Initial manifestation of many of the electrophysical phenomena causing wearout may be in form of timing degradation of circuit components, but they may eventually result in failure of transistors and/or interconnects. Hence, the guardband test circuit may be configured to detect them.

Hierarchical Reliability Management

A preemptive error avoidance mechanisms may be added to improve circuit reliability. These mechanisms may operate in two ways:
1. Circuit operation point adjustment: In this approach, errors may be avoided by changing the circuit's operating parameters, such as reducing frequency or increasing voltage. This approach may trade performance and/or power efficiency for reliability.
2. Using planned redundancy: Cold or hot spares can be used to replace or temporarily disable unreliable CUTs. Redundancy in the form of checker units can also be engaged or disengaged based on the reliability state of the circuit.

Error avoidance mechanisms can be implemented at different granularities. For example, operation point adjustment or placement of cold spares can be at the pipe-line stage level or at the core level in the other extreme. Error avoidance does not necessarily need to be at the same granularity as monitoring. For example, if the CUT being monitored is an ALU, then error avoidance can be done at the ALU level or can be at the execution stage of a processor pipeline which encompasses the ALU that is being monitored. The latter option may be more feasible in most large circuits.

Distributed Vs. Central RMU Control

The infrastructure may use distributed autonomous RMUs where one RMU is attached to each circuit block tested. Each RMU may be capable of monitoring timing margin of the CUT it is attached to and hence its wearout state. These distributed RMUs may have localized control (implemented within the DTC subunits) and can individually adapt to the wearout state of the CUT they are attached to by adjusting the intensity of testing and selecting the subset of critical paths which are tested.

Figure 5:
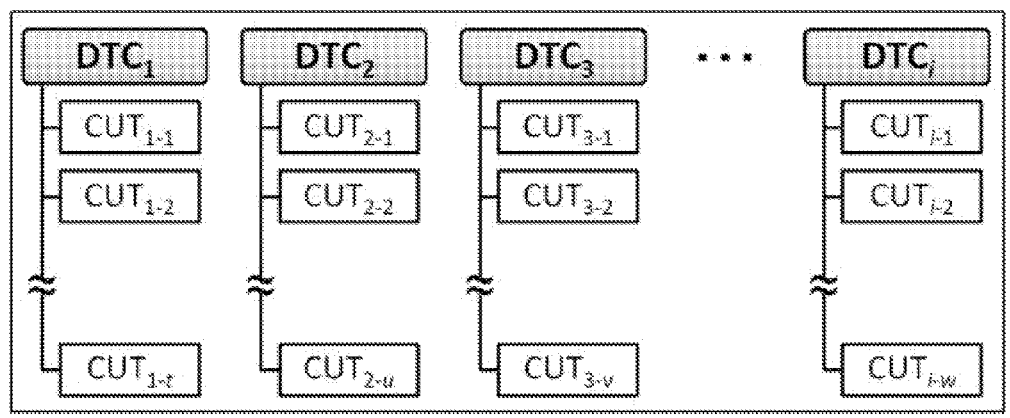
FIG. 5 illustrates an example of central control and reporting.

The RMUs may become less robust when the CUT size is large since the number of critical paths may increase with CUT size. Monitoring larger group of critical paths may require more TVR capacity and more testing time. In order to better monitor large CUTs, multiple RMUs may be implemented, each monitoring a smaller sub-circuit of the large CUT. However, multiple RMUs may increase the area overhead associated with monitoring control logic. Allowing multiple RMUs to share a single centralized DTC unit may be a good solution to reduce this overhead. In this design, each sub-circuit may have an associated TVR, but the test control may be done through a centralized DTC. FIG. 5 illustrates an example of central control and reporting. Each of the i DTC units shown in this figure control a group of CUTs. This central control of multiple distributed CUTs may have the following benefits:
1. Central DTCs may have information about a larger section of the circuit and hence control policies can be enhanced to take advantage of this additional information.
2. The logic required for implementation of the DTC policies can be time shared between multiple CUTs. Gradual nature of wearout allows for such sharing of resources without any loss of monitoring effectiveness.

3. Error avoidance may work more effectively with larger CUTs. The size of the circuit block which has the central DTC can therefore be increased enough to match the error avoidance implementation granularity.

The centralized DTC unit may receive timing margin information from each of the smaller CUTs that it is monitoring within the large CUT. The DTC may report the worst timing margin from all the smaller CUTs as the overall timing margin of the larger CUT.

An example illustrates the benefits of a centralized DTC. Assume that a centralized DTC2, shown on FIG. 5, monitors CUT2-1 to CUT2-$u$. At a given instance, the DTC2 identifies that the CUT2-1 has not suffered from timing degradation and the slowest path in this CUT has a delay of D1. On the other hand, the CUT2-2 has suffered from some wearout induced timing degradation and hence the slowest path in this CUT has a delay of D2>D1. The CUT2-3 has de-graded even more and its slowest path delay is D3>D2>D1. Assume the rest of the CUTs attached to the DTC2 (i.e. the CUT2-4 to CUT2-$u$) all have a critical path with a delay smaller than D1

In the scenario described above, the CUT2-3 has the least amount of timing margin left. The uneven wearout of CUTs could be due to many reasons, such as higher utilization of a CUT or presence of hot spots near the CUT. The CUT2-3 dictates the overall timing margin of the group of CUTs monitored by the DTC2, even though other CUTs attached to the DTC2 have larger timing margins. The DTC2 exploits this global knowledge to reduce the testing frequency range for checking all the CUTs it is controlling by reducing maximum test clock frequency for testing to 1/D3. Thus, the delay of the paths in none of the CUTs controlled by the DTC2 is going to be checked below D3. Even if some CUTs in this group have a delay less than D3, this lower delay would not change the output of the DTC2 which is reporting the largest path delay in the group. By reducing the test frequency range, the DTC2 prevents redundant testing. This results in power savings and reduced testing overhead.

When the test frequency range is reduced, the CUT with the least timing margin may dictate how all other CUTs monitored by the same DTC are tested. However, the timing margin of this CUT may recover if some of the stress-causing conditions are removed. In this case the test frequency range may be expanded again. The dynamic shrinking and expanding of the test frequency range is shown in the following algorithm:

The following algorithm may be used:
Algorithm 1. Test Frequency Range Adjustment for Multiple CUTs Sharing One DTC Unit
Procedure CritPathTest(j, F_test_Maxi, D_Maxi-j)
Inputs: Index of the CUT to get tested (j) and the maximum clock frequency to be used for testing (F_test_Maxi)
Output: Delay of the slowest path in CUTi-j(D_Maxi-j)
Conduct critical path testing for CUTi-j using the methodology described in Section 2 with test frequency range between F_test_Maxi and 1/Tclk, where Tclk is the system clock period. The output of this test is D_Maxi-j;
Procedure AdjustTestFreqRange(w, D_Max_initi-j)
Inputs: Number of CUTs (w) attached to the DTCi and ini-tial delay of the slowest path in each of these CUTs (D_Max_initi-j, for 1≤j≤w)
Output: Maximum test frequency to be used for all CUTs controlled by DTCi (F_test_Maxi)
D_Maxi=D_Max_initi-1;
for each CUTi_j with 1<j≤w
if D_Max_initi-j>D_Maxi then D_Maxi=D_Max_initi-j;
end
for each CUTi_j with 1≤j≤w
CritPathTest(j, 1/D_Maxi, D_Maxi_j);
if D_Maxi_j>D_Maxi then D_Maxi=D_Maxi-j;
end
F_test_Maxi=1/D_Maxi;

General steps on how the DTCs with central knowledge from multiple CUTs can be used to decrease and increase the monitoring clock frequency range are described next. The CritPathTest procedure does the critical path testing described above. This procedure has two inputs which provide the index of the CUT which needs to get tested (j) and the maximum clock frequency to be used for the testing that CUT (F_test_Maxi), where i is the index of the DTC which controls CUTi-j. All CUTs monitored by DTCi will get the same maximum test frequency value F_test_Maxi as an input. The output of this procedure will be the delay of the slowest path in CUTi-jas measured by testing (D_Maxi-j).

The AdjustTestFreqRange procedure is used to expand the test frequency range occasionally to detect if any of the CUTs have recovered some of their timing slack. The inputs to the AdjustTestFreqRange procedure are number of CUTs (w) attached to the DTCi and initial delay (as determined by static timing analysis at design time) of the slowest path in each of these CUTs (D_Max_initi-j). The output would be maximum test frequency to be used for all CUTs controlled by DTCi (F_test_Maxi). For each CUT that is monitored by a central DTC, critical path testing is done using the full range of test frequency. The full test frequency range is from frequency without guardband to frequency with guardband. This procedure checks the path delays in a CUT as if it is a new CUT, even if a prior CritPathTest procedure indicated that the CUT has de-graded timing margin. By occasionally expanding the test frequency range this procedure can detect if a CUT has recovered from wearout, as can happen in some wearout mechanisms such as NBTI.

Distributed and autonomous RMUs may be best for monitoring circuits which have a limited number of CUTs scattered on the chip. On the other hand, when a large number of CUTs on the chip need to be monitored and specially when there are clusters of CUTs within functional unit blocks (FUB), the central RMU control using central DTCs for sub-groups of CUTs may be more suitable.

Error Avoidance Implementation Issues

Error avoidance mechanisms can be implemented at granularity of the CUTs monitored by the RMU. However, if the CUT size is small, error avoidance at a small granularity can result in inefficiency and in some cases is even be infeasible. For example, implementation cost of multiple voltage or frequency domains to change CUT operational point may significantly increase if CUTs are small.

CUT size for monitoring may be small enough to ensure efficiency of RMU's operation. Error avoidance may be provided at a larger granularity in order to reduce implementation cost and increase its operation efficiency. To address these conflicting goals, a hierarchical design may be used. A chip may be divided into multiple error avoidance domains and each domain may be associated with a single Error Avoidance Unit (EAU). Each domain may consist of multiple circuit blocks divided into groups. The timing degradation of each group of circuit blocks may be monitored using the central DTC. In other words, each circuit block within a group may use the circuit-specific test vectors, but the test control may be done by a centralized DTC for that group. Each error avoidance domain may have multiple groups, where each group may be monitored by a central DTC. The DTCs may report the timing margin of each group of circuits they are monitoring to an error avoidance unit associated with that domain. Each error avoidance unit can change the operational point of the entire domain based on the timing de-gradation information it receives from all the RMUs in that domain.

Figure 6:
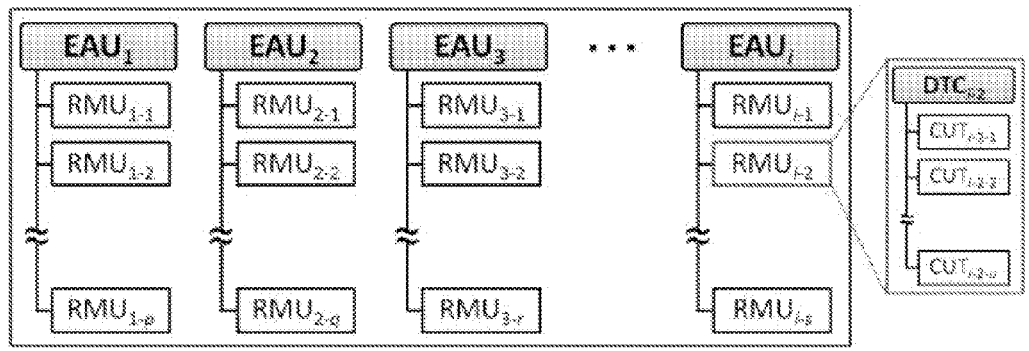
FIG. 6 shows a circuit that is divided into i error avoidance domains and each domain has one EAU.

FIG. 6 shows a circuit that is divided into i error avoidance domains and each domain has one EAU. Hence, there are i error avoidance units indexed EAU1 to EAUi. There are multiple circuit groups in each error avoidance domain and each of these groups is monitored using a RMU. The index used for each RMU is in the form of i-j where i represent the EAU number (which is also the index of the error avoidance domain) and j is the RMU number within that domain. Each RMU is in turn using a central DTC that monitors circuits within that group. This is shown for RMUi-2 as a central DTCi-2 attached to u CUTs indexed CUTi-2-1 to CUTi-2-$u$.

Control of error avoidance mechanisms can be done locally at each domain. Each error avoidance mechanism can make independent decisions on how to preemptively reduce errors in that domain. For example when a processor has been enhanced with three independent DVFS controllers, these controllers can be utilized to control frequency and voltage of the associated error avoidance domain. These power management domains, which are already implemented in many systems, can form error avoidance domains and information regarding the wearout state of different FUBs within each domain can be collected using multiple RMUs. A key property of this hierarchical implementation is the high degree of configurability which is necessary for tackling conflicting requirements of monitoring and error avoidance mechanisms. Selection of the error avoidance granularity and monitoring granularity can be decoupled with this hierarchical design.

Circuits produced from unreliable components can be used in a wide range of applications. There are circuits that can tolerate a certain amount of unreliability while there are other circuits that are required to operate reliably during a long lifetime. In systems with a high priority of lifetime reliability, such as in circuits used in medical devices or server class processors dealing with financial transactions, the cost of unreliable operation or unpredictable failure is extremely high. In such systems the budget allocated for reliability monitoring may be higher. Whereas, in other application domains where reliability is a secondary concern, the budget for monitoring may be significantly less. The design that has been described herein can provide a highly configurable and customizable implementation that can fit the monitoring needs of different systems.

Cross-Layer Resilience Using Wearout Aware Design Flow

Figure 7:
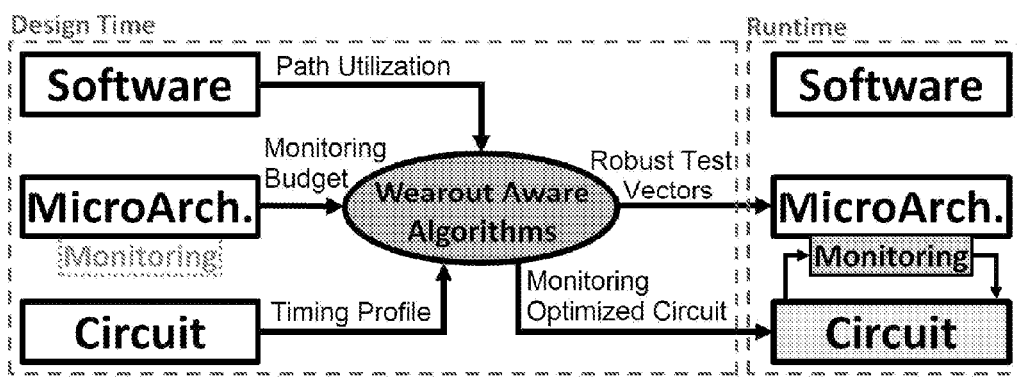
FIG. 7 illustrates a cross-layer design flow methodology that may be employed that combines static path timing information with runtime path utilization data to significantly enhance monitoring efficiency and robustness.

FIG. 7 illustrates a cross-layer design flow methodology that may be employed that combines static path timing information with runtime path utilization data to significantly enhance monitoring efficiency and robustness. FIG. 7 shows a layered framework consisting of two phases:

1. Cross-layer design flow (CLDF) phase: This phase (marked as "Design Time" in the figure) uses representative application inputs to derive circuit path utilization profile. The microarchitecture specification provides monitoring budget, such as the amount of chip area or the power consumption allocated for monitoring. CLDF also derives timing profile from static timing analysis of circuit's design. The wearout aware algorithm then combines information from software, microarchitecture and circuit layers to drive circuit design optimizations with the explicit goal of making a circuit amenable for robust and efficient monitoring. The algorithm selects a refined group of paths along with a robust set of input vectors for wearout monitoring.

2. Wearout monitoring phase: A runtime wearout monitoring phase, similar to what is discussed above, continuously monitors the paths selected from the CLDF phase. The information about the circuit paths which need to be monitored, obtained from the CLDF phase, is used in the runtime phase for wearout detection.

The focus of this effort is to develop the CLDF framework. As such, it is assumed that a wearout monitoring mechanism exists in the underlying microarchitecture. CLDF significantly enhances the applicability of existing runtime monitoring approaches. For example, where wearout sensors or canary circuits are used for monitoring, CLDF will identify circuit paths that are most susceptible to failure thereby allowing the designer to select the most appropriate location of the wearout sensors or canary circuitry. When in situ monitoring approaches are used, only the most susceptible circuit paths reported by the CLDF framework are monitored. It should be noted that although the CLDF framework can be used with all the above mentioned reliability monitoring approaches. Throughout this discussion, it is assumed that the underlying microarchitecture uses an in situ monitoring approach similar to what has been discussed above to illustrate how design phase optimizations can enhance runtime monitoring efficiency.

A cross-layer circuit design flow methodology may combine static path timing information with runtime path utilization data to significantly enhance monitoring efficiency. This framework uses path utilization profile, path delay characteristics, and number of devices in critical paths to optimize the circuit using selective path constraint adjustments (i.e. increasing the timing margin of selected group of paths). This optimization results in a new implementation of the circuit which is more amenable for low overhead monitoring of wearout-induced timing degradation.

Algorithms may be used for selecting the best group of paths to be observed as early indicators of wearout induced timing failures. Each of these algorithms may allow the designer to tradeoff area and power overhead of monitoring with robustness and efficiency of monitoring.

A hybrid hierarchical emulation/simulation infrastructure may be used to study the effects of application level events on gate-level utilization profile. This setup may provide a fast and accurate framework to study system utilization across multiple layers of the system stack using a combination of FPGA emulation and gate-level simulation. In an era when computers are built from increasing number of components with decreasing reliability, multilayer resiliency is becoming a requirement for all computer systems. A low cost and scalable solution is presented in which different layers of the computer system stack can communicate and adapt both at design phase and during the runtime of the system.

Cross-Layer Design Flow

The CLDF may use an approach that modifies the distribution of path timing margins, so as to create a group of critical paths that are more likely to fail before any other paths fail. The paths that are likely to fail first are referred to as wearout-critical paths. Wearout-critical paths would be ideal candidates for being monitored as early indicators of wearout. CLDF receives a monitoring budget, in terms of the area and power overhead allowed for monitoring, as input from the designer. CLDF uses three characteristics of the circuit, namely path timing, path utilization profile, and number of devices on the path, to select a limited number of wearout-critical paths to satisfy the monitoring budget constraints specified by the designer.

Paths which are selected to be monitored at runtime are going to be checked regularly using approaches like those described in "WearMon: Reliability Monitoring Using Adaptive Critical Path Testing," Dependable Systems and Networks, pp. 151-160, 2010; S. Shyam, K. Constantinides, S. Phadke, V. Bertacco, and T. Austin, "Ultra low-cost defect protection for microprocessor pipelines," ACM Sigplan Notices, vol. 41, pp. 73-82, November 2006; Y. J. Li, S. Makar, and S. Mitra, "CASP: Concurrent Autonomous chip self-test using Stored test Patterns," Design, Automation and Test in Europe, pp. 885-890, 2008; A. H. Baba and S. Mitra, "Testing for Transistor Aging," VLSI Test Symposium, pp. 215-220, 2009; and D. Ernst, N. S. Kim, S. Das, S. Pant, R. Rao, T. Pham, C. Ziesler, D. Blaauw, T. Austin, K. Flautner, and T. Mudge, "Razor: A low-power pipeline based on circuit-level timing speculation," International Symposium on Microarchitecture, pp. 7-18, 2003.

The runtime monitoring frameworks may test the circuit (or canary circuit) at a test frequency, ftest, which is higher than the normal operation frequency, f0+GB=1/T0+GB. T0 is the delay of slowest paths in the circuit at design time and hence ideally the circuit can operate at that clock period at fabrication time. As mentioned earlier, designers add a guardband (increase the clock period) to deal with wearout. T0+GB is the clock period of the system with added guardband, which is the nominal operational clock period of the circuit. If multiple tests, each at a clock period that falls within the T0 and T0+GB range (1/T0+GB<ftest<1/T0), were preformed the test results would provide information about the exact amount of timing degradation in paths tested. It is assumed that the above described approach is used for wearout monitoring.

The following is an overview of the algorithmic steps that may be followed:

1. The circuit may be first synthesized using conventional design flow. Performance, power, and area constraints are provided as inputs to the synthesis tool. The synthesis tool generates the implementation of the design and an initial static timing report that shows the timing margin of each circuit path. The first step in CLDF takes this synthesized design as input and sorts all the circuit paths in the timing report based on their timing margin. It then selects some number of paths, say nLong, with least timing margin. These nLong paths are further analyzed in the rest of the steps.
2. The second step may be where the cross-layer aspect of design flow comes into effect. In this step, CLDF selects a representative set of workloads and runs them on the synthesized design. Utilization profile of the nLong paths selected in the first step is collected. The profile provides information regarding how frequently each path has been exercised during the execution of the selected workloads.
3. One of the four approaches discussed below may be used to select two groups of paths from the nLong paths: a) Path to be optimized further. b) Paths to be monitored at runtime.
4. Paths selected in group 3(a) are optimized to be faster which results in more timing margin for these paths. By optimizing paths in 3(a) the approach creates a distinct separation of timing criticality between the two path group. This separation causes paths in the group 3(b) to be wearout-critical paths that allow for robust monitoring. It should be noted that groups 3(a) and (b) are not mutually exclusive and depending on the approach selected by the CLDF framework there might be paths which are in both groups and are optimized and also selected for being monitored.
5. This step collects necessary data to enable robust runtime monitoring of paths in group 3(b). This step is dependent on the monitoring framework used. For example if a runtime wearout monitoring is used, such as described in B. Zandian, W. Dweik, S. H. Kang, T. Punihaole, and M. Annavaram, "WearMon: Reliability Monitoring Using Adaptive Critical Path Testing," Dependable Systems and Networks, pp. 151-160, 2010, the input vectors that would sensitize the paths in group 3(b) are created in this step. These inputs are then stored in a test vector repository to enable runtime monitoring. If approaches like those described in A. C. Cabe, Z. Y. Qi, S. N. Wooters, T. N. Blalock, and M. R. Stan, "Small Embeddable NBTI Sensors (SENS) for Tracking On-Chip Performance Decay," International Symposium on Quality Electronic Design, pp. 1-6, 2009 or D. Ernst, N. S. Kim, S. Das, S. Pant, R. Rao, T. Pham, C. Ziesler, D. Blaauw, T. Austin, K. Flautner, and T. Mudge, "Razor: A low-power pipeline based on circuit-level timing speculation," International Symposium on Microarchitecture, pp. 7-18, 2003, are used for runtime monitoring, then location of the paths in group 3(b) and their structure should be stored so that canary circuits can be designed for them or wearout sensors can be inserted at appropriate locations. As stated earlier, it is assumed that a monitoring approach based on test vector injection for path testing is used.

Step 1: Selection of the Analysis Group

The first step in CLDF is to use a traditional synthesis tool to synthesize the design and perform static timing analysis. The hardware description language (HDL) code for the design in addition to performance, area, and power constraints are provided as inputs to the synthesis tool. The output of this initial synthesis will be the gate-level implementation and a timing report that indicates the amount of timing margin for each circuit path. CLDF then generates a sorted path list based on timing margin and selects a group of nLong longest paths (paths with the least timing margin). These paths are considered for optimization and/or runtime monitoring as we will describe later. The selection of nLong paths is done as follows. CLDF selects nLong paths based on an initial cut-off criteria (InitCutoff) given as input to the algorithm.

CLDF selects only those paths whose delay is larger than InitCutoff percentage of the maximum path delay. For example if the delay of the longest path in the circuit is 10 ns and if InitCutoff is selected as 75%, then CLDF picks all paths with delay of 7.5 ns or higher; this approach ensures that all paths within 75% of the worst-case delay are selected for analysis. The cutoff parameter is selected by the designer based on the worst-case wearout expected in a design within the typical lifetime of the processor. All wearout causing phenomena, such as NBTI, and Electromigration, may reach a maximum wearout level beyond which they cause device failure. In fact, this knowledge is what is used by conservative circuit design approaches for selecting a guardband to prevent premature failures; when a designer selects a 10% guardband the assumption is that no path with more than 10% timing margin will fail before the expected lifetime of the processor. Hence, InitCutoff is simply the conservative guardband that has already been estimated at design time.

For circuits with steep critical path timing walls, using InitCutoff may result in selection of a large group of paths for further analysis, thereby making nLong a very large number.

Large nLong values do not create any impediment in the next steps of CLDF algorithm. Similarly, for circuits with shallow critical path timing walls nLong may be small. If nLong is too small (smaller than the number of paths which can be monitored efficiently), then there is no need to even conduct further analysis since the circuit does not have many critical paths and it may be possible to monitor all critical paths without further analysis or need for CLDF. The main goal, however, may be to make circuits with steep critical path timing walls (large nLong values) still amenable for monitoring.

Step 2: Utilization Based Path Prioritization

Step 2 generates utilization profile of nLong paths. The utilization data is collected while executing a representative set of applications that are expected to run on the design. During execution of representative applications the number of times each of the nLong paths is utilized is saved. Then nLong paths are sorted based on the cumulative number of times each path was utilized during profile runs; this sorted list is called the utilization profile.

CLDF uses HighUtilCutoff parameter given as input to CLDF to identify paths that have utilization greater than HighUtilCutoff percent of the maximum utilization reported for the nLong paths. These paths are demarcated as high utilization paths. CLDF also uses a LowUtilCutoff parameter and any path with utilization lower than this cutoff is demarcated as a low utilization path. The rationale behind using two cutoffs is to create two distinct groups of paths with very different utilization levels. As explained shortly, this clear separation between high and low utilization is used to create robust and efficient monitoring mechanisms.

Timing degradation of a circuit path is a sum of the degradation of all the devices on that path. Hence, if all other parameters are the same, more devices on a path result in more susceptibility to wearout induced timing degradation. As such CLDF uses device counts on a path to further differentiate between paths. CLDF uses a single input parameter called DevCutoff to demarcate paths with high or low device counts. The criteria for specifying these parameters are described later.

After gathering the utilization profile, CLDF divides nLong paths into three categories based on HighUtilCutoff, LowUtilCutoff, and DevCutoff. Timing margin of one category of paths will be increased; these are referred to as the optimized group. Another category contains those paths that are monitored for wearout at runtime, which is referred to as the monitored group. The third category contains paths that are neither optimized nor monitored. Four path categorization algorithms are discussed. These algorithms provide different tradeoffs between performance, power, area, and reliability.

Figure 8:
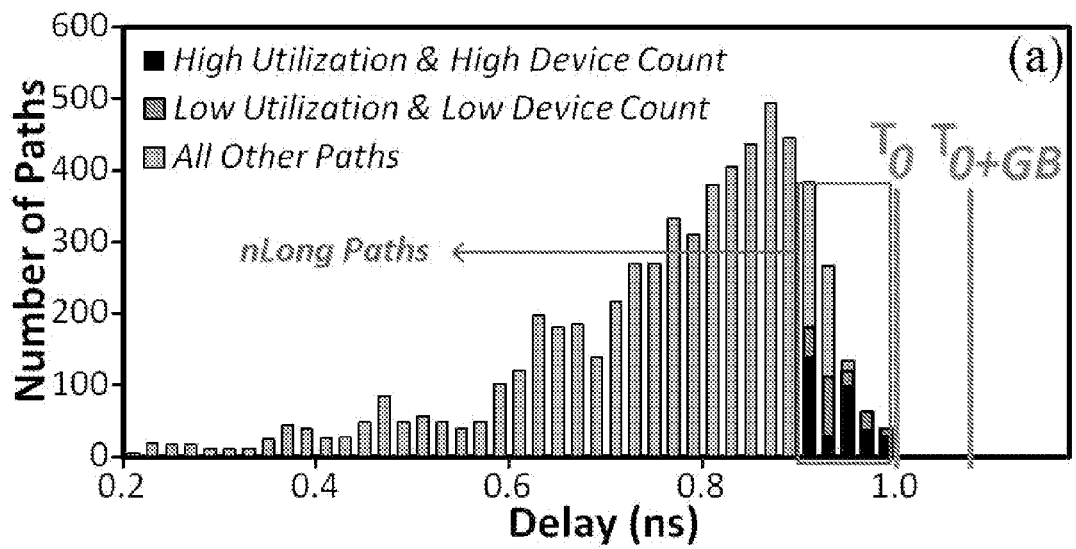
FIG. 8 illustrates an initial delay distribution of a sample circuit taken from an OpenSPARC T1 processor.

An illustrative example is used to show how path categorization is done While describing the four algorithms. For this purpose, FIG. 8 illustrates an initial delay distribution of a sample circuit taken from an OpenSPARC T1 processor. This sample circuit is the instruction decode block of the instruction fetch unit (sparc_ifu_dec). The timing constraint used for synthesis is 0.95 ns (T0 or zero timing margin path delay). It is assumed there is a 0.09 ns timing guardband added by the designer to deal with wearout. Hence, the resulting system clock period is 1.04 ns (T0+GB). In this discussion it is assumed that we use 90% as the InitCutoff value. Hence, we select nLong paths that are within 90% of the longest timing paths. All paths in the right most five columns of FIG. 8 form the nLong paths. There are three types of paths highlighted with shades of black in FIG. 8: high utilization & high device count, low utilization & low device count, and all other paths.

The group marked high utilization & high device count are the paths that have utilization that exceeds the HighUtilCutoff and device count that exceeds the DevCutoff 282 parameters. Similarly, low utilization & low device count are the paths that have utilization that is below the LowUtilCutoff and device count that is below the DevCutoff parameter. Intuitively, the separation of paths into three types based on utilization and device count provides an opportunity to shift steep critical timing walls by not treating all paths with the same timing margin as equally important. Instead, path heterogeneity is created with device count and utilization information derived from application level information. By exploiting this crucial runtime information through design time utilization analysis, critical path timing walls can be avoided, as shown in the next step.

Step 3: Approaches for Selecting Monitored Paths

The output from this step is the identification of paths that are used for monitoring. It is assumed that a designer has a fixed budget to monitor only nMonitor paths (based on the area, power, and performance budget allocated for monitoring). Hence, the goal is to select a total of nMonitor paths. In this section four approaches are described that are designed for path selection.

Approach 1: Monitor Least Reliable

Figure 9:
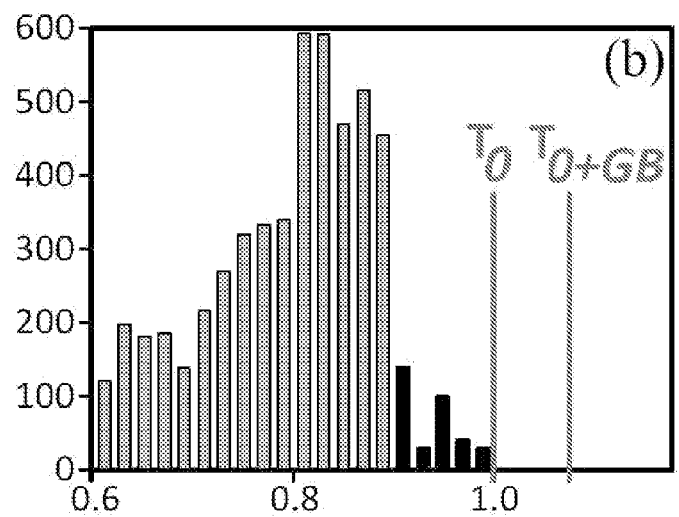
FIG. 9 shows the delay distribution of the same sample circuit after using an approach for selecting monitored paths.

The goal of this approach is to create a distinct group of paths which, with high probability, are the paths that are going to have wearout induced timing failure before the rest of the paths. These paths will be monitored and used as predictors of imminent timing violations. Approach 1 achieves this goal by reshaping the path delay distribution of the circuit as follows. A group of paths that are most susceptible to wearout are selected for monitoring. Concurrently, all the paths that are not monitored are removed from the critical path wall by increasing the timing margin of these paths. Since paths that are not monitored have higher timing margin the probability of path not monitored failing before the monitored group is reduced. FIG. 9 shows the distribution of a sample circuit before using Approach 1 and the redistribution of the paths after applying Approach 1. The paths with the most delay in the redistributed plot, highlighted in black on FIG. 9, are the group left for monitoring while all other paths are moved away from the critical path wall.

Paths optimized: This approach starts with the utilization profile generated in Step 2 of the algorithm, which sorts nLong paths based on path utilization. The HighUtilCutoff parameter is used to select paths with high utilization, i.e. paths with utilization greater than the cutoff parameter. The high utilization paths are then sorted based on the number of devices on each path. This newly sorted list is divided by using DevCutoff parameter and the high device count and low device count paths are identified. The end of this process ends up with three sets of paths: high utilization & high device count, high utilization & low device count, and the remaining paths without any concern for their device count. High utilization & high device count paths are then separated from the nLong paths. The remaining paths (nLong paths excluding high utilization & high device count paths) are optimized to have a larger timing margin. The increase in the margin is equal to the initial circuit guardband. Path optimization is done by resynthesizing the design using stricter timing constraint for the paths selected. The delay of the optimized paths can be reduced, for instance, by increasing the size of devices used on these paths. Since the optimized paths have more timing margin they are also significantly less likely to cause timing violations.

Paths monitored: The high utilization & high device count paths which are not optimized (black bars in FIG. 9) will form the set of paths which are going to be continuously monitored for wearout. These paths have a higher probability of suffering the most wearout. These paths are utilized more frequently and utilization has a first order effect on many of the wearout causing phenomena. These paths also have more devices on them and are more susceptible to timing degradation caused by wearout of their devices. Runtime monitoring would check the path delay degradation of these paths between T0 and T0+GB and will alert the system if any monitored path delay gets critically close to T0+GB.

Discussion of Approach 1: The goal is to select a total of nMonitor paths where all paths have the characteristic of high utilization & high device count. A main motivation for using HighUtilCutoff selection criteria is to pick a subset of nLong paths with a distinctly higher utilization compared to the rest of the nLong paths in that circuit. To satisfy this goal, HighUtilCutoff can be selected in the range of 75% to 85% of the maximum utilization in the nLong path group. If a smaller percentage is selected, the relative utilization difference between the paths selected and the ones not selected would become smaller and hence the goal of leveraging utilization differences between paths will not be satisfied.

A few special cases are worth mentioning. First, if the number of paths in the high utilization & high device count category are more than the monitoring budget simply select the most utilized nMonitor paths from this category and optimize the remaining paths even in this category. On the other hand, in some circuits the number of paths categorized as high utilization & high device count, after applying HighUtilCutoff and DevCutoff, may be fewer than nMonitor. In this case, fill the remaining paths for monitoring from high utilization & low device count category as well thereby removing these paths from further optimization.

A goal is to deal with circuits which have many more paths than the nMonitor. If the paths selected to be in the nLong path group are fewer than nMonitor paths, then it is not necessary to use the CLDF approach and all paths in the nLong group can simply be monitored.

The value used for nMonitor has a direct impact on the area overhead of Approach 1. If nMonitor is small then the number of paths which are not monitored will be large and hence the area overhead of the optimization is going to increase. Recall that all the paths in nLong group that are not monitored will be optimized, which usually requires increasing device sizes. Furthermore, paths optimized with larger device sizes also lead to higher dynamic power 283 consumption whenever these paths are exercised. These overheads can be reduced if the monitoring overhead is increased, by selecting larger nMonitor. Of course there is the tradeoff that more paths being monitored would mean more overhead for the monitoring setup.

One advantage of Approach 1 is that it does not perturb paths with high utilization & high device count which typically are the most power hungry paths in a circuit. On the other hand, since it does not perturb the high utilization & high device count paths the optimization effort and the resulting area overhead would not improve circuit's susceptibility to timing failures since the high utilization & high device count paths still have a small timing margin. In other words, this approach only has the benefit of making any circuit with any path distribution suitable for monitoring and will increase robustness and effectiveness of monitoring but it does not change the fundamental wearout behavior of the circuit.

For designs which have stringent power and area constraints but can tolerate some performance degradation (e.g. mobile device chips that are more constrained by power and area than maximum frequency), Approach 1 can be implemented in an alternative way. Paths which are selected for monitoring can be de-optimized while keeping all other paths the same. In other words, increase the clock period and reduce the speed of high utilization & high device count paths to match the lower timing demands. All the other paths remain untouched and hence they will all gain additional timing margin while the high utilization & high device count paths will be the wearout critical paths used in monitoring.

Approach 2: Two Monitoring Groups

Figure 10:
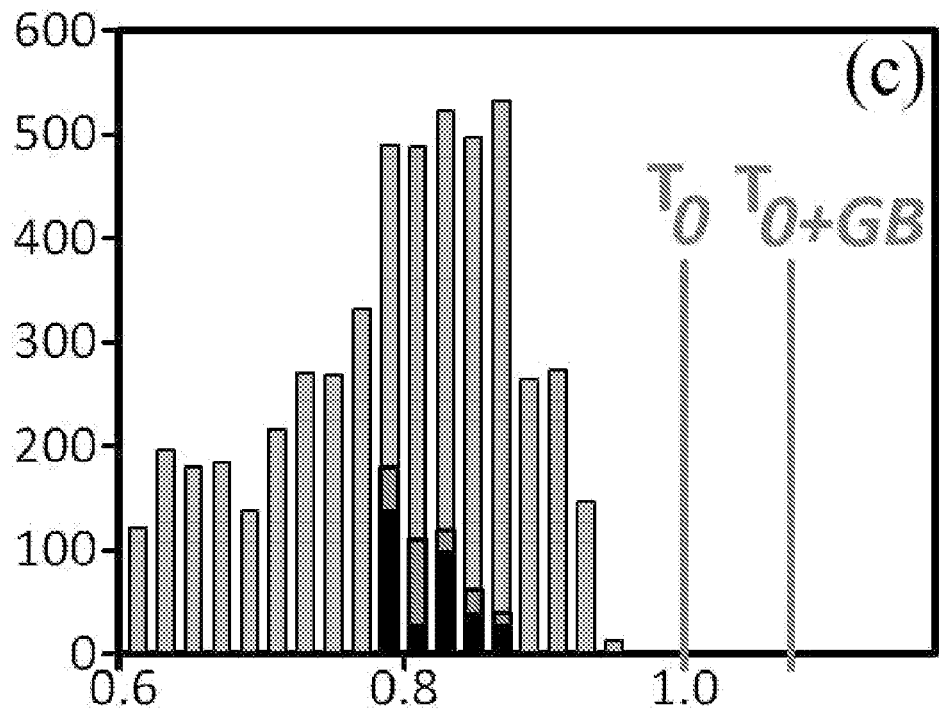
FIG. 10 illustrates a redistribution of the same sample circuit shown in FIG. 8 after an alternative redistribution algorithm.

Goals of this approach are twofold: (1) monitor the paths which are most susceptible to wearout but also make sure that the optimization effort of CLDF results in a longer lifetime of the circuit in presence of wearout. (2) Increase robustness of monitoring even if the path utilization during in-field operation varies from the utilization profile collected from representative applications. In order to achieve the first goal of improving reliability, first the paths most susceptible to wearout are monitored as in Approach 1. In addition these monitored paths are also optimized to improve the lifetime of the circuit. To achieve the second goal we also monitor a second subset of paths that are not necessarily the most wearout susceptible during the profile run. FIG. 10 illustrates the redistribution.

Paths monitored: The monitoring budget is split equally into two groups. First group of paths to be monitored, called Group 1, is the same as those selected in Approach 1, namely, high utilization & high device count paths selected using the selection polices described in Approach 1, except that only nMonitor/2 paths are selected. The paths selected for monitoring are removed from the nLong paths. The remaining paths are then sorted in descending order based only on utilization without any constraint on device count. The second half of monitored paths, called Group 2, is selected from the top of this newly sorted list. Group 2 increases the robustness of monitoring since it selects half the paths that are categorized as not as susceptible during profile run.

Paths optimized: All paths except those in Group 2 are optimized. By optimizing paths in Group 1 the most susceptible paths will have more timing margin and the overall circuit lifetime is increased. By not optimizing paths in Group 2, which are not as susceptible to wearout, a distinct group of paths is created with very different timing margin profile that are simultaneously monitored thereby further improving monitoring robustness. In particular, by not optimizing Group 2 while at the same time monitoring Group 2, the reliance on profile data accuracy is reduced.

Discussion of Approach 2: In Approach 2 every path in the nLong group is either monitored or optimized or both. In particular, there are no paths that are neither optimized nor monitored. This approach is particularly suitable for designs with larger monitoring budget (nMonitor) and circuits with clustering of a large number of paths in the low utilization & low device count paths.

Approach 3: Virtual Critical Paths

In the first two approaches there is no limit on the number paths optimized which may lead to unacceptable area and/or power overheads for some circuits. Approach 3 focuses on limiting area and power overheads from optimization while still retaining monitoring efficiency of prior approaches. The approach relies on a small change to monitoring process itself to achieve its goal. Monitoring is done using a higher testing frequency than the previous two approaches.

Paths monitored and optimized: Approach 1 is used to select nMonitor paths for monitoring. Then, only the paths selected for monitoring are optimized and all other paths are untouched. In Approach 1, all other paths that are not monitored are optimized, where as in Approach 3, exactly the same group of paths that are also monitored are optimized. Thus, the area and/or power overhead associated with optimizing remains fixed (based on the nMonitor paths) independent of the number of nLong paths.

Figure 11:
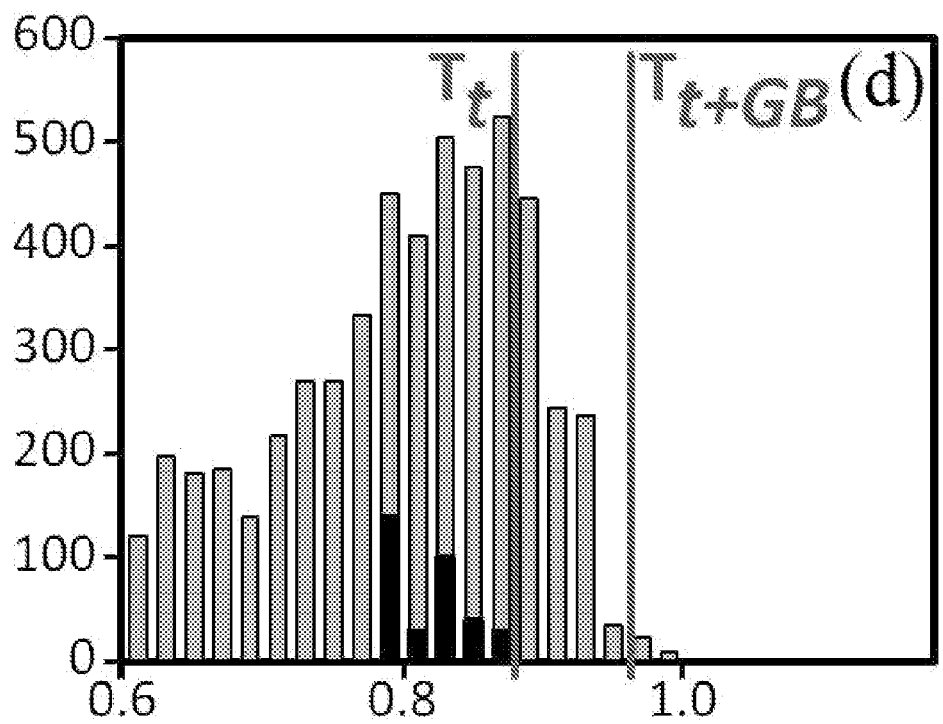
FIG. 11 illustrates a redistribution of path delays that make the sample circuit amenable for a new test clock range in which paths are monitored.

Modifications to monitoring hardware: In this approach the monitoring hardware itself has to be modified. Testing of the critical paths selected for monitoring needs to be done using a different testing clock frequency, ftest, than the one described early, which is 1/T0+GB<ftest<1/T0. When Approach 3 is employed, a test clock period that is shorter than the actual clock period of the system is going to be used for monitoring; this is referred to as a virtual test clock. Since paths monitored are also the paths optimized, monitored paths no longer have the smallest amount of timing margin. For monitoring purposes, however, these paths are treated as if they are still the most critical paths (virtually critical). The monitored paths are in high utilization & high device count category, even though they are optimized. These paths will suffer the most wearout during in-field operation. Thus Approach 3 still monitors most wearout susceptible paths. Since these paths are also optimized they have more timing margin and hence they would not threaten the systems performance or lifetime. FIG. 11 illustrates the new test clock range in which these paths are monitored. The new test clock period 284 FIG. 3. Flow chart of evaluation methodology is between Tt and Tt+GB instead of between T0 and T0+GB. Tt is the delay of the slowest optimized path and Tt+GB is Tt plus the same guardband. The paths highlighted in black are the ones most susceptible to wearout and have been optimized and are also monitored.

Approach 4: Two Monitoring Domains

Approach 3 creates a set of paths that are monitored at an elevated test clock frequency with the assumption that monitoring the most utilized paths that are also optimized will be sufficient to detect wearout. After the path redistribution of Approach 3 there will be a new set of critical paths which are not going to be monitored. These are the paths which have a larger delay than Tt as shown on FIG. 11. These paths have lower predicted utilization than the paths monitored. Hence the assumption is that these paths are less susceptible to wearout. However, during infield operation if the utilization varies from the utilization profile collected from representative applications then the prediction may not be accurate. In this case, paths that have a smaller timing margin may become susceptible to failure. Approach 4 eliminates this susceptibility by adding additional paths to monitor from these smaller timing margin paths.

Figure 12:
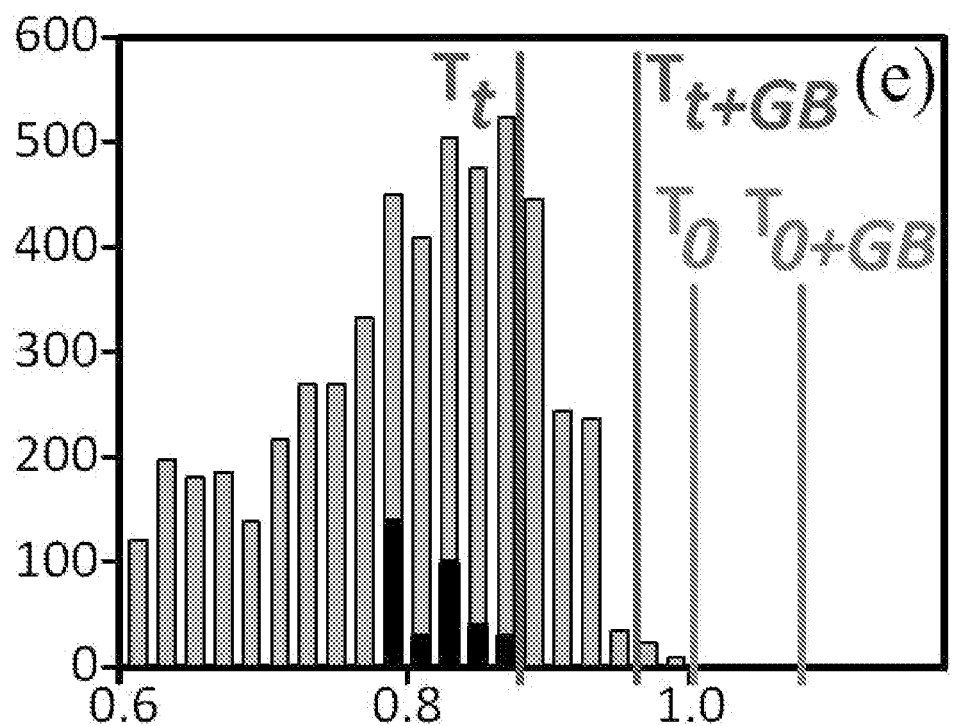
FIG. 12 illustrates a different kind of redistribution of path delays that make the sample circuit amenable for a new test clock range in which paths are monitored.

Paths optimized and monitored: This approach monitors two groups of paths. Paths in Group 1 are selected the same way as Approach 3. However, Approach 4 selects half the number of paths (nMonitor/2) to monitor using the virtual test clock (between Tt and Tt+GB). The Group 1 paths selected for monitoring are also optimized as in Approach 3 (number of paths optimized is half of nMonitor paths). Paths selected in Group 1 are removed from nLong paths. The second half of the monitored paths, called Group 2, is selected from the paths remaining in nLong paths. The remaining paths are sorted in descending order based on their utilization and the top nMonitor/2 paths are selected. Group 2 paths are monitored using a test clock with period between T0 and T0+GB (this is the original test frequency range used by Approach 1 and 2). Thus Approach 4 uses two monitoring test frequency ranges. Group 2 paths are the ones with the least timing margin after optimizing Group 1 paths. Group 2 paths have a delay above Tt as shown on FIG. 12.

Modifications to monitoring hardware: The additional monitoring cost incurred in this approach would be due to the need for additional control hardware to enable monitoring at two different test frequency ranges. This slightly more complex monitoring hardware would reduce the sensitivity of monitoring to path utilization profiling accuracy since two distinctly different sets of paths are monitored. D.

Summary of Approaches

The following table summarizes the four approaches discussed:

| Path Utilization | Path Device Count | App. 1 Opt. | App. 1 Mon. | App. 2 Opt. | App. 2 Mon. | App. 3 Opt. | App. 3 Mon. | App. 4 Opt. | App. 4 Mon. |
|---|---|---|---|---|---|---|---|---|---|
| High | High (1) | No | Yes | Yes | Yes | Yes | Yes | Yes | Yes |
|  | Low (2) | Yes | No | No | Yes | No | No | No | Yes |
| Low | High (3) | Yes | No | No | Yes | No | No | No | No |
|  | Low (4) | Yes | No | Yes | No | No | No | No | No |

As shown in this table, nLong critical circuit paths in the analysis set can be grouped into four categories based on utilization and devices count: (1) High utilization & high device count (2) High utilization & low device count (3) Low utilization & high device count (4) Low utilization & low device count. Each of the four approaches (labeled as App. 1 to 4) are going to select a subset of each of the above four path categories to be optimized (Opt.) and/or to be monitored (Mon.). III.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

For example, an operating system may be configured to function as the automated guardband compensation system 107. In this configuration, the switching circuit 109 may not be needed. One may also use a specialized runtime system or virtual machine layer or a special firmware to assist in detecting guardband reduction and compensating the guardband.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases in a claim mean that the claim is not intended to and should not be interpreted to be limited to any of the corresponding structures, materials, or acts or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

The terms and expressions used herein have the ordinary meaning accorded to such terms and expressions in their respective areas, except where specific meanings have been set forth. Relational terms such as first and second and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by "a" or "an" does not, without further constraints, preclude the existence of additional elements of the identical type.

The Abstract is provided to help the reader quickly ascertain the nature of the technical disclosure. It is submitted with the understanding that it will not be used to interpret or limit the scope or meaning of the claims. In addition, various features in the foregoing Detailed Description are grouped together in various embodiments to streamline the disclosure. This method of disclosure is not to be interpreted as requiring that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as separately claimed subject matter.

The invention claimed is:

1. An automated guardband compensation system for automatically compensating for degradation in the guardband of a clocked data processing circuit while that circuit is connected within a data processing system comprising:
   a switching circuit configured when requested to switch a critical path in the clocked data processing circuit out of and back into a data processing pathway in the data processing system while the clocked data processing circuit is connected within the data processing system;
   a guardband test circuit configured when requested to test for degradation in the guardband of the critical path while the critical path is switched out of the data processing pathway;
   a guardband compensation circuit configured when requested to increase the guardband; and
   a control circuit configured to automatically and repeatedly request:
      the switching circuit to switch the critical path out of the data processing pathway while the clocked data processing circuit is connected within the data processing system;
      the guardband test circuit to test the guardband of the critical path while the critical path is switched out of the data processing pathway;
      the guardband compensation circuit to increase the guardband when the results of the test indicate a material degradation in the guardband; and
      the switching circuit to switch the critical path back into the data processing pathway after the test.

2. The automated guardband compensation system of claim 1 wherein:
   the clocked data processing circuit is operated within the data processing system at a normal clock frequency; and
   the guardband test circuit is configured to test for degradation in the guardband by testing the critical path at multiple, different test clock frequencies, each higher than the normal clock frequency.

3. The automated guardband compensation system of claim 2 wherein the guardband test circuit is configured to test for degradation in the guardband by detecting whether the clocked data processing circuit fails to function properly at any of the test clock frequencies.

4. The automated guardband compensation system of claim 1:
   further comprising a test vector storage system containing multiple test vectors, each configured to test a different critical path in the clocked data processing circuit while that circuit is connected within the data processing system; and
   wherein the guardband test circuit is configured to use the test vectors to test different critical paths in the clocked data processing circuit for degradation in the guardband of each tested critical path.

5. The automated guardband compensation system of claim 4 wherein:
   a result is stored in the test vector storage system for each test vector that is indicative of how the critical path that is associated with the test vector should function in response to the test; and
   the guardband test circuit is configured to test each critical path by determining whether the result that it produces in response to the test vector that tests it is consisted with the corresponding result stored in the test vector storage system.

6. The automated guardband compensation system of claim 5 wherein:
   the test vector storage system is configured to store at least one test vector that is configured to test a non-critical path in the clocked data processing circuit while that circuit is connected within the data processing system; and
   the guardband test circuit is configured when requested to test for degradation in the guardband of the at least one non-critical path while the non-critical path is switched out of a data processing pathway.

7. The automated guardband compensation system of claim 4 wherein the test vectors are selected based on the degree to which their associated critical paths are used during normal operation of the data processing system.

8. The automated guardband compensation system of claim 1 wherein:
   the clocked data processing circuit is operated within the data processing system at a clock frequency; and the guardband compensation circuit is configured to increase the guardband by decreasing the clock frequency.

9. The automated guardband compensation system of claim 1 wherein:
the clocked data processing circuit is operated within the data processing system at an operating voltage; and
the guardband test compensation is configured to increase the guardband by increasing the operating voltage.

10. The automated guardband compensation system of claim 1 wherein the guardband test compensation is configured to increase the guardband by switching in a replica of at least a portion of the clocked data processing circuit in place of at least that portion of the clocked data processing circuit.

11. The automated guardband compensation system of claim 1 wherein the critical path does not contain any data storage element, other than at the beginning or end of the path.

12. The automated guardband compensation system of claim 1 wherein the control circuit is configured to make the requests to the switching circuit and to the guardband test circuit periodically.

13. The automated guardband compensation system of claim 1 wherein the control circuit is configured to make the repeated requests to the switching circuit and to the guardband test circuit during idle periods of the clocked data processing circuit.

14. The automated guardband compensation system of claim 1 wherein the control circuit is configured to alter the frequency of the repeated requests based on one or more operating conditions of the clocked data processing circuit.

15. The automated guardband compensation system of claim 1 further comprising a test result storage system configured to store the results of the tests.

16. The automated guardband compensation system of claim 1 wherein the control circuit is configured to alter the frequency of the repeated requests based on the results of the tests that are stored in the test results storage system.

17. The automated guardband compensation system of claim 1 wherein the automated guardband compensation system and the clocked data processing circuit are within a common integrated circuit.

18. A automated guardband compensation system for automatically compensating for degradation in the guardband of a clocked data processing circuit while that circuit is connected within a data processing system comprising:
a test vector storage system containing multiple test vectors, each configured to test a different critical path in the clocked data processing circuit while that circuit is connected within the data processing system;
a guardband test circuit configured when requested to test for degradation in the guardband of a specified critical path in the clocked data processing circuit while that clocked data processing circuit is connected within the data processing system;
a guardband compensation circuit configured when requested to increase the guardband; and
a control circuit configured to automatically and repeatedly request:
the guardband test circuit to test the guardband of more than one of the critical paths using the test vectors for those critical paths while the clocked data processing circuit is connected within the data processing system; and
the guardband compensation circuit to increase the guardband when the results of a test indicate a material degradation in the guardband.

19. The automated guardband compensation system of claim 18 wherein:
a result is stored in the test vector storage system for each test vector that is indicative of how the critical path that is associated with the test vector should function in response to the test vector; and
the guardband test circuit is configured to test each critical path by determining whether the result that it produces in response to the test vector that tests it is consisted with the corresponding result stored in the test vector storage system.

20. The automated guardband compensation system of claim 19 wherein:
the test vector storage system is configured to store at least one test vector that is configured to test a non-critical path in the clocked data processing circuit while that circuit is connected within the data processing system; and
the guardband test circuit is configured when requested to test for degradation in the guardband of the at least one non-critical path while the non-critical path is switched out of a data processing pathway.

21. The automated guardband compensation system of claim 20 wherein the test vectors are selected based on the degree to which their associated critical paths are used during normal operation of the data processing system.

22. The automated guardband compensation system of claim 18 wherein the automated guardband compensation system and the clocked data processing circuit are within a common integrated circuit.

* * * * *